United States Patent
Yeh et al.

(10) Patent No.: US 12,038,659 B2
(45) Date of Patent: *Jul. 16, 2024

(54) DISPLAYS WITH DATA LINES THAT ACCOMMODATE OPENINGS

(71) Applicant: Apple Inc., Cupertino, CA (US)

(72) Inventors: Shin-Hung Yeh, Taipei (TW); Warren S. Rieutort-Louis, Cupertino, CA (US); Abbas Jamshidi Roudbari, Saratoga, CA (US); Chien-Ya Lee, Taipei (TW); Lun Tsai, Zhubei (TW)

(73) Assignee: Apple Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/182,222

(22) Filed: Mar. 10, 2023

(65) Prior Publication Data
US 2023/0221606 A1    Jul. 13, 2023

Related U.S. Application Data

(63) Continuation of application No. 17/525,118, filed on Nov. 12, 2021, now Pat. No. 11,619,851, which is a (Continued)

(51) Int. Cl.
*G02F 1/1362* (2006.01)
*G09G 3/20* (2006.01)
(Continued)

(52) U.S. Cl.
CPC ......... *G02F 1/136286* (2013.01); *G09G 3/20* (2013.01); *H10K 59/122* (2023.02);
(Continued)

(58) Field of Classification Search
CPC .......... G02F 1/136286; G02F 1/13629; G02F 2001/13629; G02F 2001/136295;
(Continued)

(56) References Cited

U.S. PATENT DOCUMENTS 8,970,804 B2   3/2015   Kwon et al.
9,704,888 B2   7/2017   Chen et al.
(Continued)

FOREIGN PATENT DOCUMENTS

CN   106601164 A   4/2017
CN   107025875 A   8/2017
(Continued)

*Primary Examiner* — Tom V Sheng
(74) *Attorney, Agent, or Firm* — Treyz Law Group, P.C.; Joseph F. Guihan; Jinie M. Guihan

(57) ABSTRACT

To minimize the width of a non-light-emitting border region around an opening in the active area, data lines may be stacked in the border region. Data line portions may be formed using three metal layers in three different planes within the border region. A metal layer that forms a positive power signal distribution path in the active area may serve as a data line portion in the border region. A metal layer may be added in the border region to serve as a data line portion in the border region. Data line signals may also be provided to pixels on both sides of an opening in the active area using supplemental data line paths. A supplemental data line path may be routed through the active area of the display to electrically connect data line segments on opposing sides of an opening within the display.

19 Claims, 11 Drawing Sheets

Related U.S. Application Data continuation of application No. 17/082,613, filed on Oct. 28, 2020, now Pat. No. 11,204,534, which is a continuation of application No. 16/505,532, filed on Jul. 8, 2019, now Pat. No. 10,852,607.

(60) Provisional application No. 62/720,705, filed on Aug. 21, 2018.

(51) Int. Cl.
*H10K 59/122* (2023.01)
*H10K 59/131* (2023.01)

(52) U.S. Cl.
CPC ....... *H10K 59/131* (2023.02); *G02F 1/13629* (2021.01); *G09G 2300/0404* (2013.01); *G09G 2300/0426* (2013.01)

(58) Field of Classification Search
CPC ............. G09G 3/20; G09G 2300/0404; G09G 2300/0426; H10K 59/131; H10K 59/122; H01L 27/3246; H01L 27/3276
USPC ......................................................... 345/206
See application file for complete search history.

(56) References Cited

U.S. PATENT DOCUMENTS

| | | | |
|---|---|---|---|
| 9,853,096 B1 * | 12/2017 | Choi | .................. H10K 59/131 |
| 10,095,078 B2 | 10/2018 | Koide | |
| 10,224,508 B2 | 3/2019 | Cai et al. | |
| 10,374,018 B2 | 8/2019 | Aoyama et al. | |
| 10,852,607 B2 * | 12/2020 | Yeh | ...................... H10K 59/122 |
| 11,204,534 B2 * | 12/2021 | Yeh | .......................... G09G 3/20 |
| 2009/0051636 A1 * | 2/2009 | Natori | .................. G09G 3/3648 |
| | | | 345/55 |
| 2016/0380004 A1 | 12/2016 | Lee et al. | |
| 2017/0154566 A1 | 6/2017 | Ryoo et al. | |
| 2017/0162111 A1 | 6/2017 | Kang et al. | |
| 2017/0162637 A1 | 6/2017 | Choi et al. | |
| 2017/0192580 A1 | 7/2017 | Jung et al. | |
| 2017/0288003 A1 | 10/2017 | Kim et al. | |
| 2017/0294502 A1 | 10/2017 | Ka et al. | |
| 2017/0309644 A1 * | 10/2017 | Yeh | ........................ H01L 27/124 |
| 2017/0372661 A1 | 12/2017 | Gu et al. | |
| 2018/0122889 A1 | 3/2018 | Kim et al. | |
| 2018/0129111 A1 * | 5/2018 | Wu | ........................ G09G 3/3648 |
| 2018/0188614 A1 | 7/2018 | Yeh | |
| 2018/0314120 A1 * | 11/2018 | Peng | ...................... G06F 3/0412 |
| 2018/0366495 A1 | 12/2018 | Xu et al. | |
| 2019/0072822 A1 | 3/2019 | Yasunaga et al. | |
| 2019/0123066 A1 | 4/2019 | Zhan et al. | |
| 2020/0106045 A1 | 4/2020 | Han et al. | |
| 2020/0127016 A1 | 4/2020 | Yang | |

FOREIGN PATENT DOCUMENTS

| | | |
|---|---|---|
| CN | 107104113 A | 8/2017 |
| CN | 107221281 A | 9/2017 |
| CN | 107293567 A | 10/2017 |
| CN | 107870492 A | 4/2018 |
| CN | 108277473 A | 7/2018 |
| EP | 3176772 A1 | 6/2017 |
| JP | 2009047902 A | 3/2009 |
| JP | 2010032760 A | 2/2010 |
| JP | 2010066461 A | 3/2010 |
| JP | 2016081031 A | 5/2016 |
| JP | 2017076115 A | 4/2017 |
| JP | 2018087863 A | 6/2018 |
| KR | 20140118010 A | 10/2014 |
| KR | 20170065059 A | 6/2017 |
| KR | 20170066767 A | 6/2017 |
| KR | 20170077780 A | 7/2017 |
| KR | 20170117291 A | 10/2017 |
| WO | 2014142183 A1 | 9/2014 |
| WO | 2015183334 A1 | 3/2015 |
| WO | 2018138779 A1 | 8/2018 |

* cited by examiner

DISPLAYS WITH DATA LINES THAT ACCOMMODATE OPENINGS

This application is a continuation of non-provisional patent application Ser. No. 17/525,118, filed Nov. 12, 2021, which is a continuation of non-provisional patent application Ser. No. 17/082,613, filed Oct. 28, 2020, now U.S. Pat. No. 11,204,534, which is a continuation of non-provisional patent application Ser. No. 16/505,532, filed Jul. 8, 2019, now U.S. Pat. No. 10,852,607, which claims the benefit of provisional patent application No. 62/720,705, filed Aug. 21, 2018, which are hereby incorporated by reference herein in their entireties.

BACKGROUND

This relates generally to displays, and, more particularly, to displays with inactive areas.

Electronic devices often include displays. For example, cellular telephones and portable computers include displays for presenting information to users. Displays such as organic light-emitting diode displays and liquid crystal displays have light-emitting active areas and inactive areas that do not emit light. If care is not taken, the inactive areas of the display may be larger than desired.

SUMMARY

A display may have an array of pixels in an active area. The display may include a first inactive area that surrounds the active area. The display may also include a second inactive area that is formed within the active area. The second inactive area may be formed by a physical opening in the display substrate that accommodates an electronic component.

The display may include data lines and gate lines that provide signals to the pixels in the display. The data lines and gate lines may need to be rerouted around the inactive area that is formed within the active area of the display.

To minimize the width of the non-light-emitting border region around the opening in the active area, data lines may be stacked in the border region. For example, data line portions may be formed using three metal layers in three different planes within the border region. A metal layer that forms a positive power signal distribution path in the active area may serve as a data line portion in the border region. A metal layer may be added in the border region to serve as a data line portion in the border region.

Data line signals may be provided to pixels on both sides of an opening in the active area using supplemental data line paths. A supplemental data line path may be routed through the active area of the display to electrically connect data line segments on opposing sides of an opening within the display. The electrical connections of the supplemental data line to the data line segments may both be in the inactive area of the display. Alternatively, the electrical connections of the supplemental data line to the data line segments may instead both be in the active area of the display. In yet another arrangement, the electrical connection between the supplemental data line and one data line segment may be in the active area of the display and the electrical connection between the supplemental data line and the other data line segment may be in the inactive area of the display.

DETAILED DESCRIPTION

Figure 1:
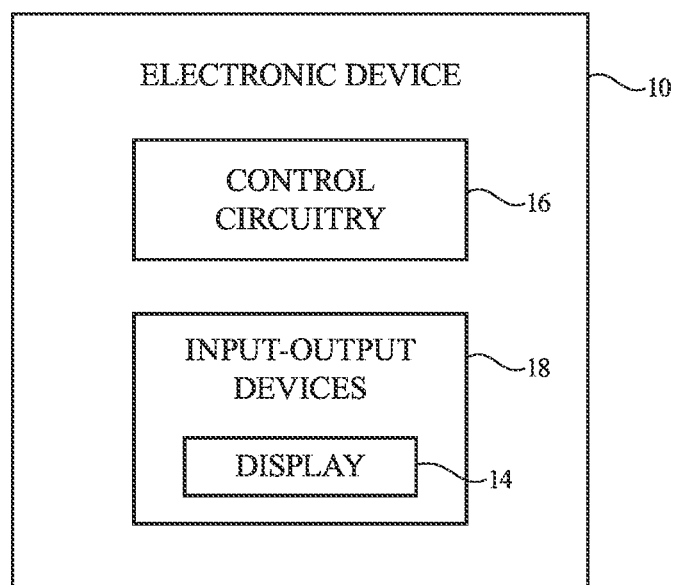
FIG. 1 is a schematic diagram of an illustrative electronic device having a display in accordance with an embodiment.

Electronic devices may be provided with displays. A schematic diagram of an illustrative electronic device with a display is shown in FIG. 1. Device 10 of FIG. 1 may be a computing device such as a laptop computer, a computer monitor containing an embedded computer, a tablet computer, a cellular telephone, a media player, or other handheld or portable electronic device, a smaller device such as a wrist-watch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmableread-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die, or any other suitable type of display. Configurations in which the pixels of display 14 include light-emitting diodes are sometimes described herein as an example. This is, however, merely illustrative. Any suitable type of display may be used for device 10, if desired.

Figure 2:
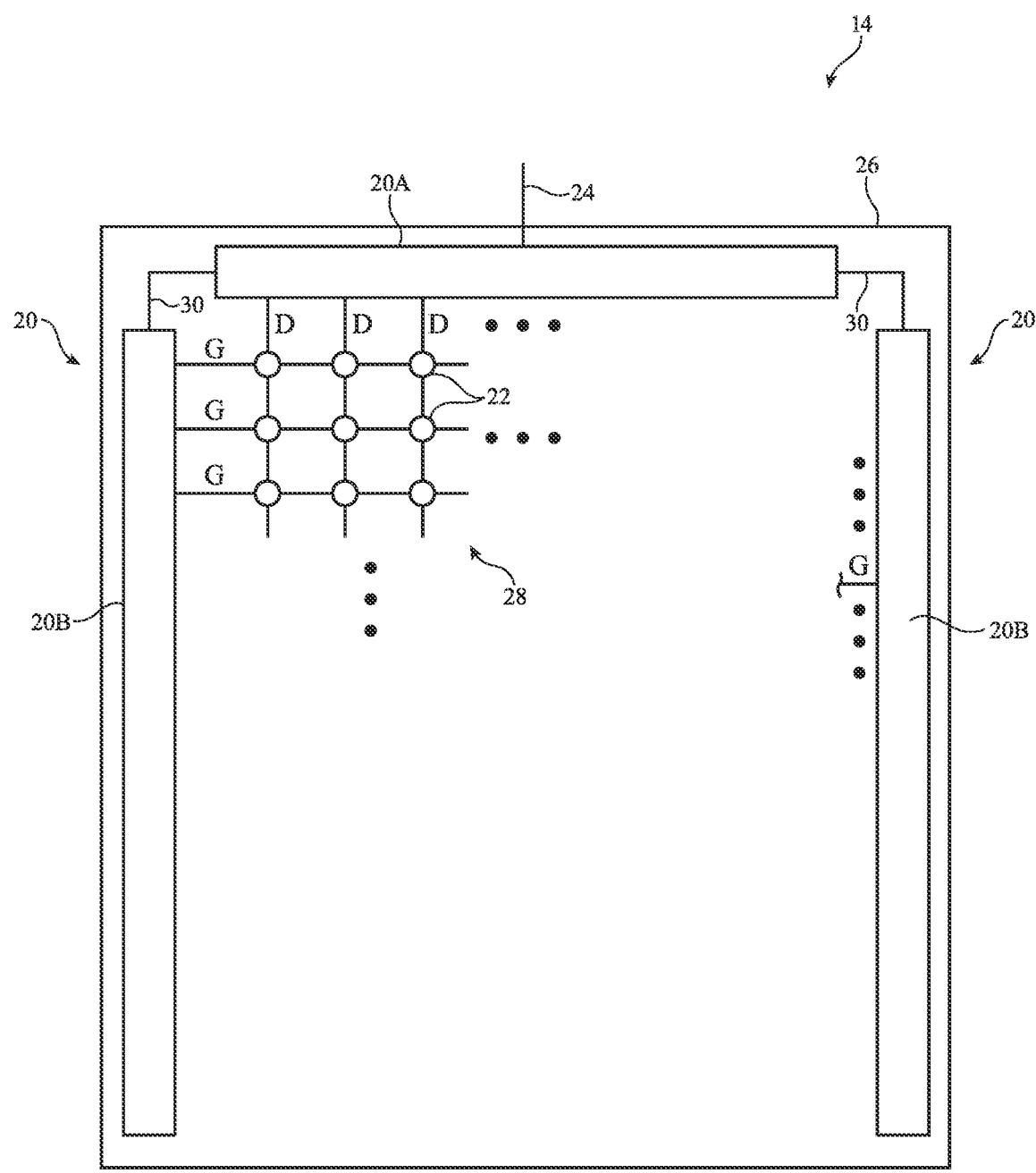
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 22. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, the control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located along the bottom edge of display 14, at both the top and bottom of display 14, or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels (e.g., a first gate line signal GI and a second gate line signal GW, one or more emission control signals, etc.). Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Figure 3:
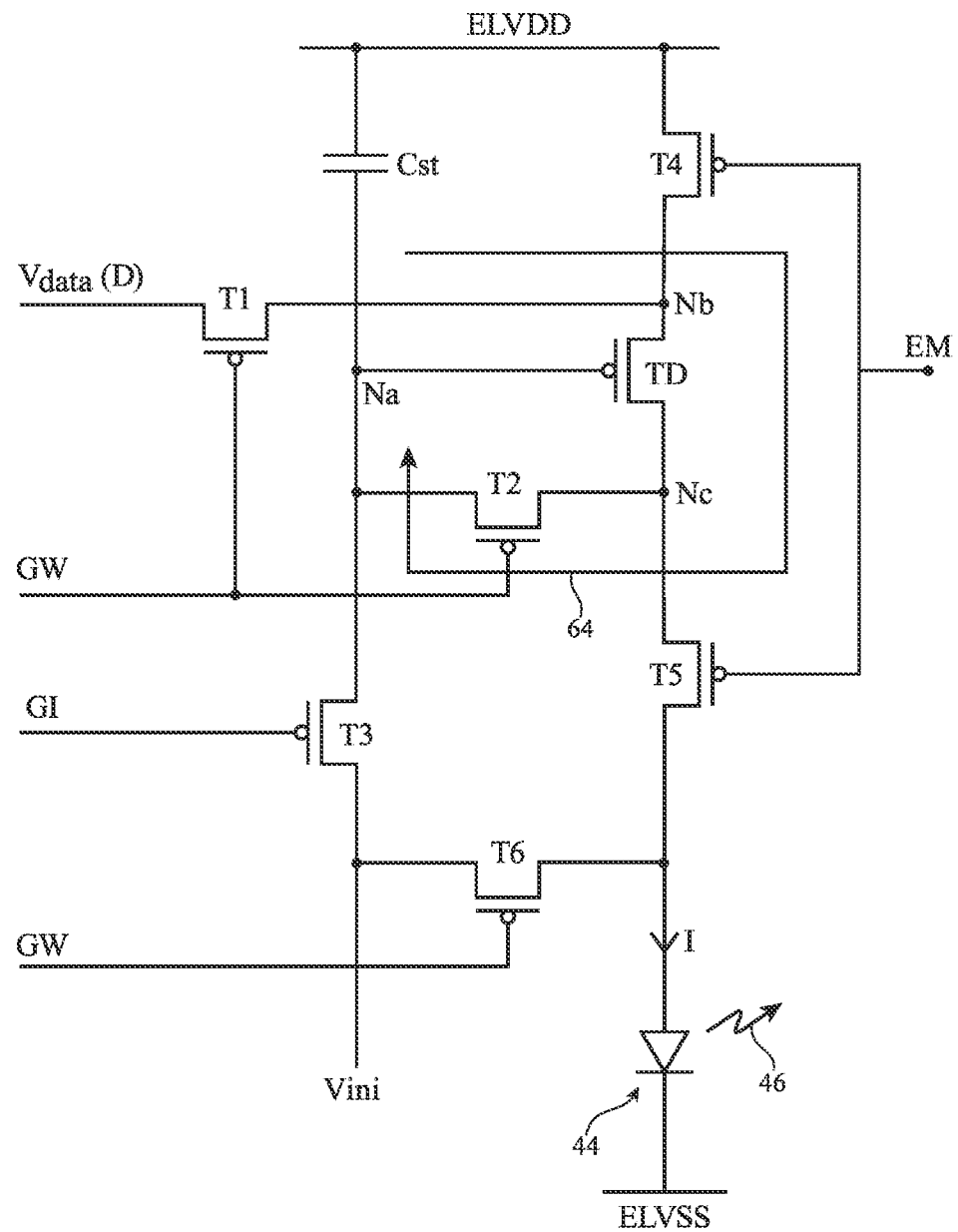
FIG. 3 is a diagram of an illustrative pixel circuit in accordance with an embodiment.

An illustrative pixel circuit of the type that may be used for each pixel 22 in array 28 is shown in FIG. 3. In the example of FIG. 3, pixel circuit 22 has seven transistors T1, T2, T3, T4, T5, T6, and TD and one capacitor Cst, so pixel circuit 22 may sometimes be referred to as a 7T1C pixel circuit. Other numbers of transistors and capacitors may be used in pixels 22 if desired (e.g., fewer transistors, more transistors, more capacitors, etc.). The transistors may be p-channel transistors (e.g., p-channel metal-oxide-semiconductor transistors as shown in FIG. 3) and/or may be n-channel transistors or other types of transistors. The active regions of thin-film transistors for pixel circuit 22 and other portions of display 14 may be formed from silicon (e.g., polysilicon channel regions), semiconducting oxides (e.g., indium gallium zinc oxide channel regions), or other suitable semiconductor thin-film layers.

As shown in FIG. 3, pixel circuit 22 includes light-emitting diode 44 (e.g., an organic light-emitting diode, a crystalline micro-light-emitting diode die, etc.). Light-emitting diode 44 may emit light 46 in proportion to the amount of current I that is driven through light-emitting diode 44 by transistor TD. Transistor TD, transistor T4, transistor T5, and light-emitting diode 44 may be coupled in series between respective power supply terminals (see, e.g., positive power supply terminal ELVDD and ground power supply terminal ELVSS). Transistor TD may have a source terminal coupled to node Nb, a drain terminal coupled to transistor T5, and a gate terminal coupled to node Na. The voltage on node Na at the gate of transistor TD controls the amount of current I that is produced by transistor TD. This current is driven through light-emitting diode 44, so transistor TD may sometimes be referred to as a drive transistor.

Transistors T4 and T5 can be turned off to interrupt current flow between transistor TD and diode 44 and transistors T4 and T5 may be turned on to enable current flow between transistor TD and diode 44. Emission enable control signal EM may be applied to the gates of transistors T4 and T5 from a shared gate line. During operation, transistors T4 and T5 are controlled by emission enable control signal EM and are therefore sometimes referred to as emission transistors or emission enable transistors. Control signals GW and GI which may sometimes be referred to as switching transistor control signals, scan signals, or gate line signals (e.g., gate initialization and gate write signals, gate signals, etc.), are applied to the gates of switching transistors T1, T2, T3, and T6 and control the operation of transistors T1, T2, T3, and T6.

Control signals EM, GI, and GW may be controlled by display driver circuitry 20 to place pixels 22 of display 14 in different states during the operation of display 14. During these different states, image data is loaded into pixels 22 and pixels 22 use light-emitting diodes 44 to emit light 46 in proportion to the loaded pixel data. To minimize threshold voltage variations due to differences in transistor history (e.g., historical Vgs values), each of the pixels can be conditioned by deliberately applying a known voltage stress to drive transistors TD (sometimes referred to as on-bias stress). This example of circuitry used to form each pixel is merely illustrative. In general, each pixel may be formed from any desired circuitry.

Figure 4:
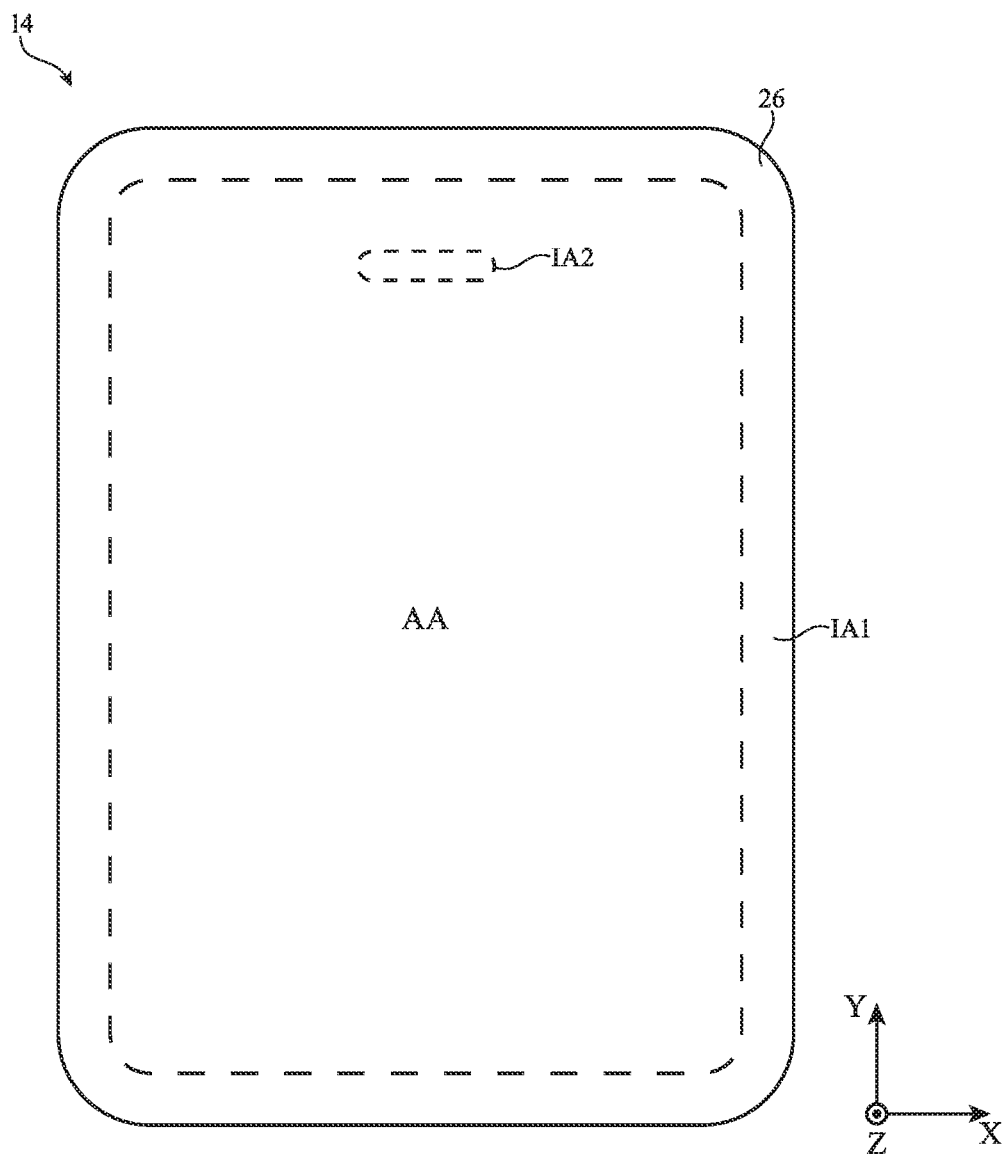
FIG. 4 is a top view of an illustrative display having an active area that is surrounded by a first inactive area and that has a second inactive area contained within the active area in accordance with an embodiment.

FIG. 4 is a top view of an illustrative display having an inactive area portion surrounded by the active area of the display. As shown in FIG. 4, substrate 26 has an active area AA and inactive areas IA1 and IA2. In the active area, substrate 26 includes pixels (e.g., pixels of the type shown in FIG. 3) that emit light to display images. The inactive area does not contain any pixels and does not display images. The inactive area may include display circuitry such as display driver circuitry 20A and gate driver circuitry 20B in FIG. 2, for example. This display circuitry may be formed in the first inactive area IA1 of display 14. Inactive area IA1 borders the active area and extends around the periphery of the active area.

The display may also include an isolated inactive area IA2 that is formed within an opening in the active area. In other words, inactive area IA2 is contained within the active area AA. Inactive area IA2 is completely laterally surrounded (e.g., within the XY-plane) by active area AA. Inactive area IA2 may sometimes be referred to as an island-shaped inactive area. There may be a physical hole in substrate 26 within inactive area IA2 or substrate 26 may be transparent within inactive area IA2 (with pixel components omitted in the inactive area IA2). An electrical component such as a speaker, camera, light-emitting diode (e.g., a status indicator), light sensor, proximity sensor, strain gauge, magnetic sensor, pressure sensor, force sensor, temperature sensor, or other sensor, button, touch-sensitive component, microphone or other audio component, or other electrical device that produces output and/or gathers input, may be mounted in the inactive area IA2.

Figure 5:
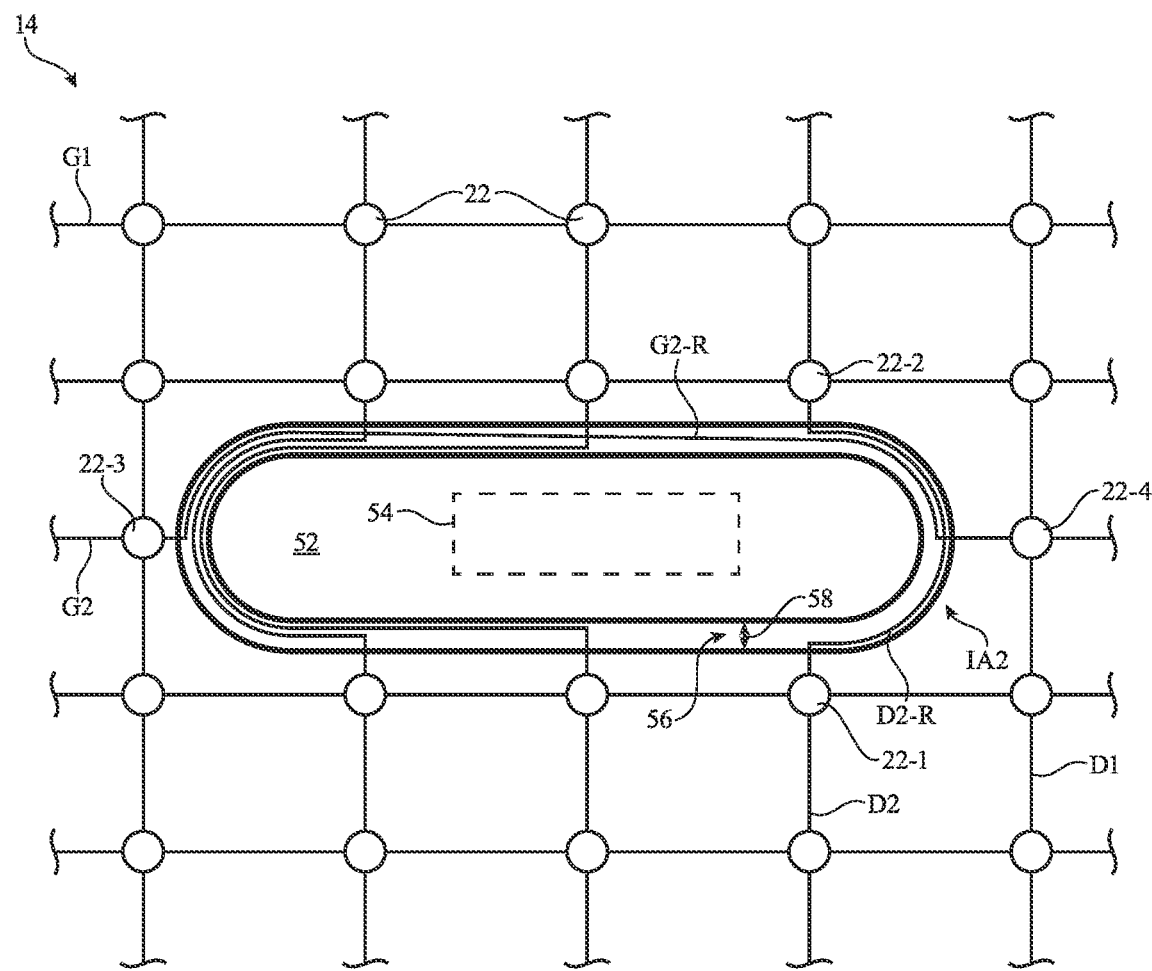
FIG. 5 is a top view of an illustrative display having an opening in an active area and signal lines routed through the border region of the opening in accordance with an embodiment.

Incorporating an inactive area within the active area of the display may require rerouting of signal lines within the display. FIG. 5 is a top view of an illustrative display with an opening in the active area and rerouted signals around the opening. As shown in FIG. 5, inactive area IA2 is formed within the active area of the display (with IA2 being surrounded on all sides by pixels 22). Inactive area IA2 may include a physical opening 52. Opening 52 may be a physical hole in the display substrate, for example. This example is merely illustrative and opening 52 may instead be a transparent window in the display that does not contain any display pixel or display signal routing components. Opening 52 may accommodate one or more electronic components 54. Component 54 may be an input-output component such as a speaker, camera, light-emitting diode (e.g., a status indicator), light sensor, proximity sensor, strain gauge, magnetic sensor, pressure sensor, force sensor, temperature sensor, or other sensor, button, touch-sensitive component, microphone or other audio component, or other electrical device that produces output and/or gathers input. In one example, component 54 may occupy the space vacated by physical hole 52. In another example, component 54 may be positioned below the display substrate with opening 52 and receive external stimulus (e.g., light) through opening 52. In embodiments where a transparent window is formed in place of opening 52, the component 54 may be formed underneath the transparent window and receive light through the window, as one example.

To minimize the amount of non-light-emitting area in the display, it is desirable for the dimensions of physical opening 52 to define the dimensions of the inactive area IA2. However, there may be a non-light-emitting border 56 formed around physical opening 52 to allow space for routing of signal lines within the display. For example, some data lines such as data line D1 are uninterrupted by the inactive area IA2. These data lines may extend vertically across the display without the need to be rerouted around physical opening 52. Similarly, some gate lines such as gate line G1 are uninterrupted by the inactive area IA2. These gate lines may extend horizontally across the display without the need to be rerouted around physical opening 52. However, some of the data lines and gate lines will be interrupted by physical opening 52 and therefore need to be rerouted around physical opening 52.

In FIG. 5, data line D2 is interrupted by physical opening 52. Data line D2 may have a portion that extends vertically, coupling to each pixel in a given column of pixels in the display. Data line D2 also has a rerouted portion D2-R that curves around physical opening 52 to connect pixel 22-1 in the given column of pixels to pixel 22-2 in the given column of pixels on the opposite side of the physical opening. Rerouted portion D2-R may be formed in a separate plane (and from a separate metal layer) than the vertical portions of data line D2. Gate line G2 is also interrupted by physical opening 52. Gate line G2 may have a portion that extends horizontally, coupling to each pixel in a given row of pixels in the display. Gate line G2 then has a rerouted portion G2-R that curves around physical opening 52 to connect pixel 22-3 in the given row of pixels to pixel 22-4 in the given row of pixels on the opposite side of the physical opening. Rerouted portion G2-R may be formed in a separate plane (and from a separate metal layer) than the horizontal portions of gate line G2.

The rerouted portions of the signal lines may be formed in non-light-emitting border 56 around physical opening 52. The larger the size of physical opening 52, the more signal lines will have to be rerouted around physical opening within border 56. This may undesirably increase the width 58 of border 56. To help minimize width 58, signal lines may be stacked in border region 56 (thus reducing the lateral area required to accommodate all of the rerouted signal lines).

Figure 6:
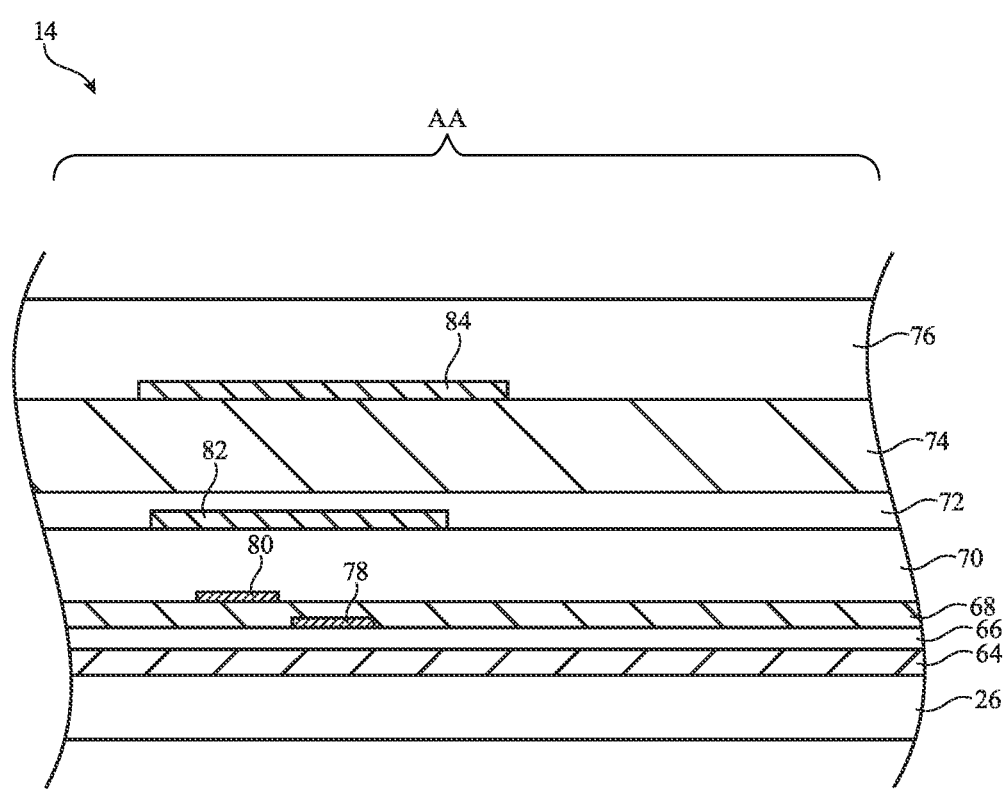
FIG. 6 is a cross-sectional side view of an active area of an illustrative display showing signal paths formed from metal layers in accordance with an embodiment.

FIG. 6 is a cross-sectional side view of a portion of a display that has stacked data lines in a border region 56 around a physical opening in an active area (similar to as shown in FIG. 5). The portion of the display shown in FIG. 6 is positioned in the active area (away from the physical opening), meaning that rerouting of the data lines is not required and the data lines therefore do not need to be stacked. As shown in FIG. 6, display 14 includes layers formed on substrate layer 26. Dielectric layers such as buffer layer 64 and gate insulator layer 66 may be formed on substrate 26. Buffer layer 64 may be an inorganic buffer layer, for example. Additional interlayer dielectric layers 68 and 70 may be formed over gate insulator layer 66. A first metal layer 78 may be formed on gate insulator 66 and covered by interlayer dielectric layer 68. Metal layer 78 may serve as a gate line (e.g., a gate line G in FIG. 2) for display 14. A second metal layer 80 may be formed on interlayer dielectric layer 68 and covered by interlayer dielectric layer 70. Metal layer 80 may serve as a gate line (e.g., a gate line G in FIG. 2) for display 14. Metal layers 78 and 80 may both serve as gate lines for a single row of pixels within the display. For example, metal layer 78 may provide signal GW (see FIG. 3) to pixels in the row whereas metal layer 80 may provide signal GI (see FIG. 3) to pixels in the row.

An additional metal layer (metal layer 82) may be formed over interlayer dielectric layer 70. Metal layer 82 (SD1) may serve as a data line (e.g., data line D in FIG. 2) for display 14. Metal layer 82 may be covered by passivation layer 72. Passivation layer 72 may be formed from an inorganic material such as silicon nitride or silicon dioxide. Passivation layer 72 may be formed from any other desired material. Organic planarization layers 74 and 76 may be formed over passivation layer 72. Organic planarization layers 74 and 76 may be formed from any desired material. Organic planarization layers 74 and 76 may be formed from the same material or from different materials.

Metal layer 84 (SD2) may be formed between organic planarization layers 74 and 76. In portions of the display other than the border of the physical hole in the substrate, metal layer 84 may serve as a power supply distribution line for display 14. For example, metal layer 84 may form a positive power supply distribution line ELVDD (as shown in FIG. 3) or may form a ground power supply distribution line ELVSS (as shown in FIG. 3).

As previously mentioned, to minimize the width of border region 56 around opening 52 (see FIG. 5), data lines may be stacked in border region 56. As shown in FIG. 6, in the active area of the display the data lines may be formed by metal layer 82. To allow the data lines to be stacked in border region 56, vias may electrically connect metal layer 82 (with data line signals) to additional metal layers in the display. The data lines may therefore have first portions formed by metal layer 82 and additional portions formed from additional metal layers within the display.

Figure 7:
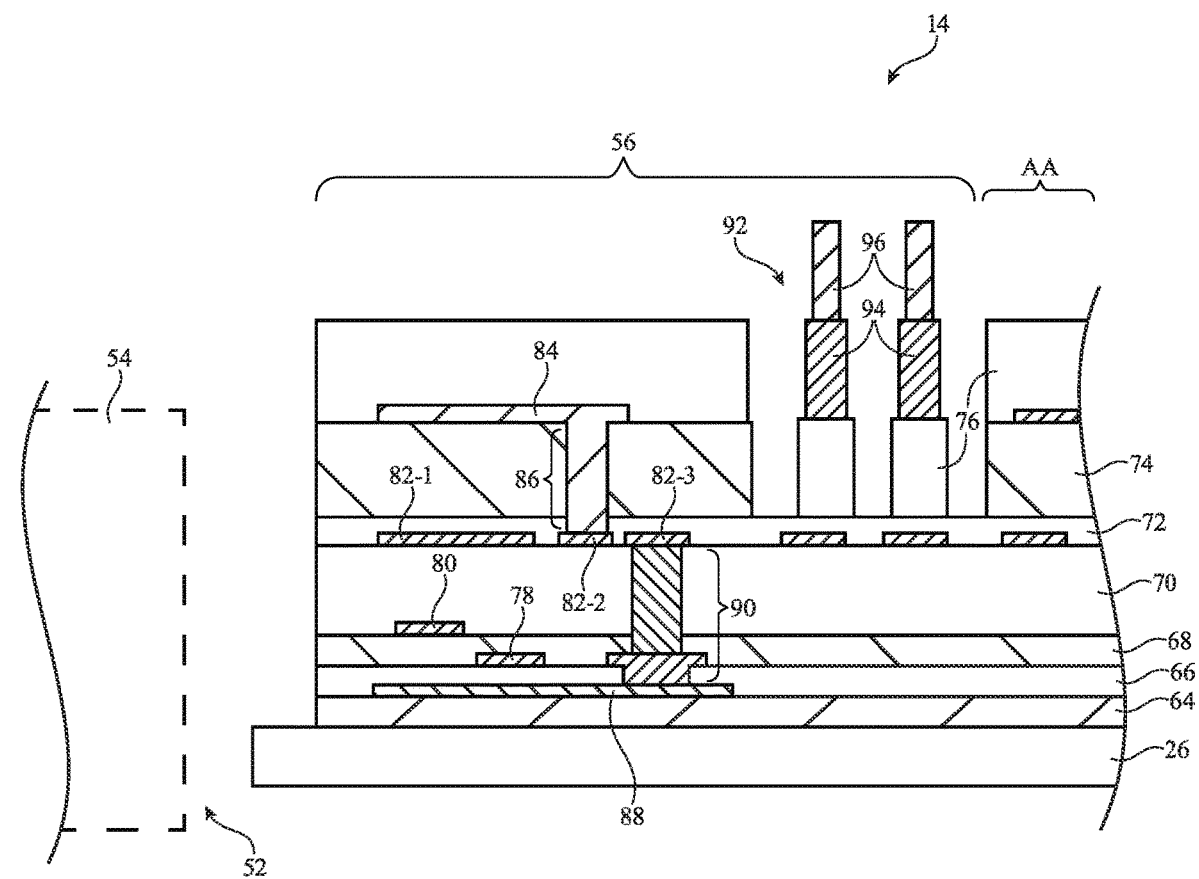
FIG. 7 is a cross-sectional side view of an active area of an illustrative display showing how data lines formed from metal layers may be stacked in accordance with an embodiment.

FIG. 7 is a cross-sectional side view of border region 56 of the display in which data lines are stacked. FIG. 7 shows substrate 26 with buffer layer 64, gate insulator 66, interlayer dielectric layers 68 and 70, passivation layer 72, and organic planarization layers 74 and 76, similar to as in FIG. 6. Metal layers 78 and 80 are formed similar to as in FIG. 6. However, FIG. 7 shows opening 52 in substrate 26. In the embodiment of FIG. 7, opening 52 is a physical opening in the substrate and input-output component 54 is formed within the opening. In an alternate embodiment, opening 52 may instead be a transparent window and input-output component 54 may be formed beneath the transparent window.

In border region 56, metal layer 82 may have multiple portions that each carry different data line signals. For example, portion 82-1 carries a first data line signal, portion 82-2 carries a second data line signal, and portion 82-3 carries a third data line signal. In other words, each portion forms part of a respective data line D. Metal layer 82-1 may remain above interlayer dielectric layer 70. However, metal layers 82-2 and 82-3 may be electrically connected to additional metal layers using vias. For example, metal layer 82-2 may be electrically connected to metal layer 84 using conductive via 86. In this way, the data line signal is electrically connected to metal layer 84 from metal layer 82-2. Therefore, in this portion of the display, metal layer 84 serves as a data line portion instead of a positive power supply distribution line ELVDD as in FIG. 6. Conductive via 86 may be formed form the same material (and in the same deposition step) as metal layer 84 if desired.

Using both metal layers 82 and 84 for data lines in border region 56 can help reduce the width of border region 56. However, additional minimizing of the border may be achieved by incorporating an additional metal layer that serves as a data line portion in border region 56. As shown in FIG. 7, metal layer 88 may be formed between gate insulator 66 and buffer layer 64. Metal layer 82-3 may be electrically connected to metal layer 88 using conductive via 90. In this way, the data line signal is electrically connected to metal layer 88 from metal layer 82-3. Therefore, in this portion of the display, metal layer 88 serves as a data line portion. In the embodiment shown in FIG. 7, conductive via 90 has a first portion formed from the same material (and in the same deposition step) as metal layer 82 and a second portion formed from the same material (and in the same deposition step) as metal layer 78. This example is merely illustrative and conductive via 90 may be formed from any desired number and type of layers of metal.

Incorporating metal layer 88 to serve as a data line in border region 56 further reduces the width of border region 56. If desired, to avoid cross-talk between the overlapped data lines (e.g., metal layer 84, metal layer 82-1, and metal layer 88 in FIG. 7 all serving as data lines), two or more of the data lines may follow interlaced paths that reduce the overlap area between the data lines. However, the separation between metal layer 88 and metal layer 84 may be sufficient to protect these data lines from cross-talk. Therefore, metal layer 88 and metal layer 84 may be fully overlapping in border region 56. Therefore, incorporating metal layer 88 as an additional data line requires no additional border width.

Border region 56 of display 14 may also include dam structures 92. Dam structures 92 may include a portion of organic planarization layer 76, an additional dielectric layer 94, and a spacer layer 96. Additional dielectric layer 94 may be formed from the same material (and in the same deposition step) as a pixel definition layer (PDL) for the display. Spacer layer 96 may be a photospacer layer. These examples of dam structures 92 are merely illustrative. If desired, dam structures 92 may also optionally be omitted. Dam structures 92 may also optionally be formed on the inner edge of border region 56. For example, in FIG. 7 dam structures 92 are formed on the outer edge of border region 56 and metal layers 84, 82-1, and 88 are interposed between dam structures 92 and opening 52. Alternatively, however, dam structures 92 may be formed on the inner edge of border region 56 and may be interposed between opening 52 and metal layers 84, 82-1, and 88.

Figure 8:
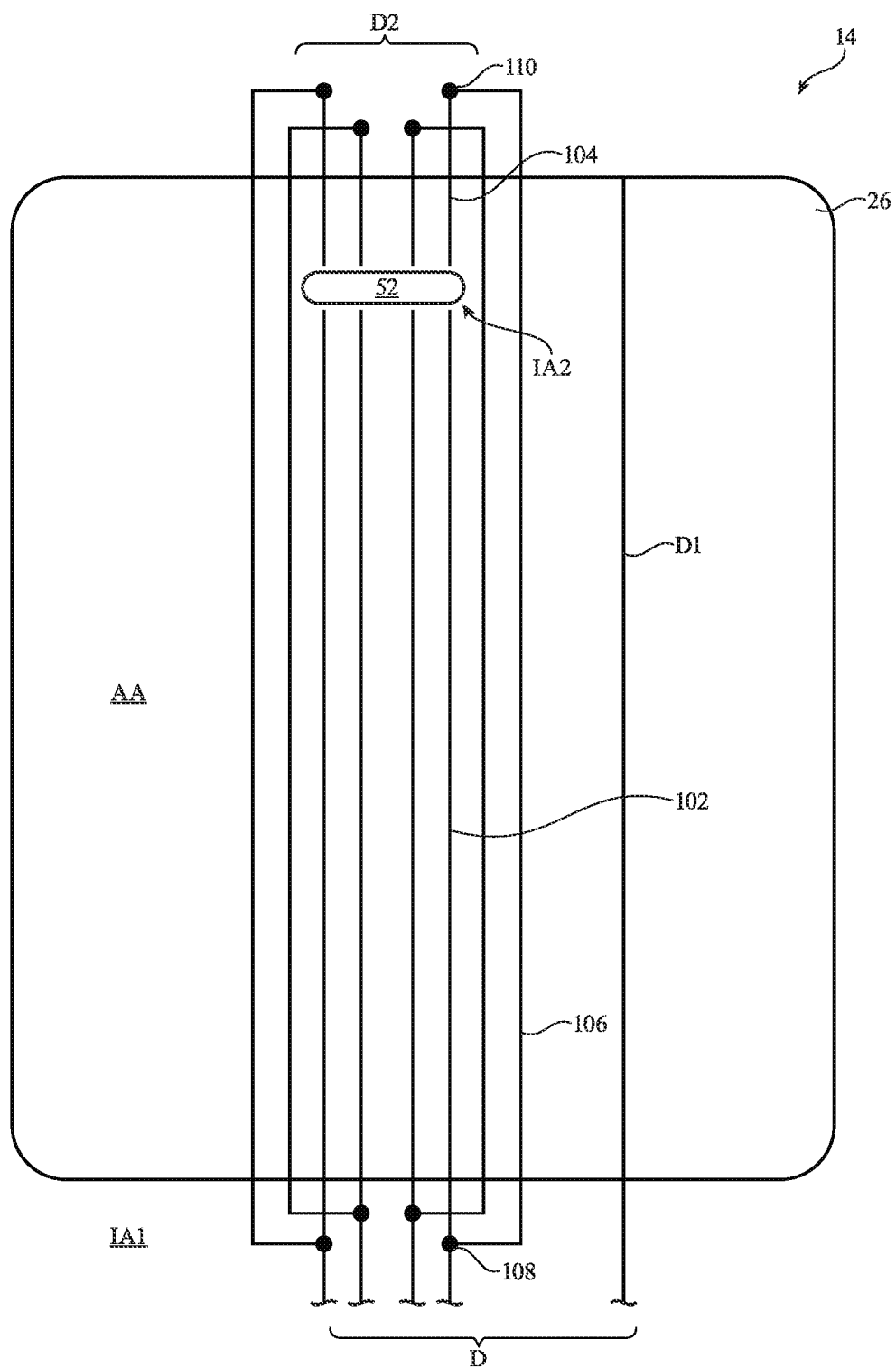
FIG. 8 is a top view of an illustrative display showing how data lines may include first and second data line segments on opposing sides of an opening in the active area and a supplemental data line that is electrically connected to both the first and second data line segments in the inactive area of the display in accordance with an embodiment.

The example of FIGS. 5-7 in which data lines are rerouted around physical opening 52 (and stacked in border region 56 around physical opening 52) is one option for providing data line signals and gate line signals to pixels on all sides of the physical opening. FIG. 8 shows an alternate arrangement in which supplemental data line paths are used to provide the data line signals to pixels on an opposite side of the physical opening.

FIG. 8 is a top view of an illustrative display having a substrate 26 with a physical opening 52. As shown in FIG. 8, display 14 may have a number of data lines D that provide signals to columns of pixels within the display. Some of the data lines, such as data line D1, are uninterrupted by physical opening 52. These data lines may therefore extend across the display to provide signals to each pixel in a column (similar to as shown in FIG. 2, for example).

Some of the data lines, such as data lines D2, may be interrupted by physical opening 52. To provide the requisite data line signals to pixels on both sides of physical opening 52, each of the data lines D2 may have a first data line segment 102 (sometimes referred to as a data line portion) on a first side of the physical opening and a second data line segment 104 (sometimes referred to as a data line portion) on a second, opposing side of the physical opening. Data line segments 102 and 104 are not electrically connected by rerouting a portion of the data line around the border of the physical opening as in FIG. 5. Instead, a supplemental data line 106 (sometimes referred to as supplemental data line path 106, supplemental data line segment 106, etc.) is provided.

Supplemental data line 106 is electrically connected to data line segment 102 in the inactive area (IA1) of the display at electrical connection 108. Supplemental data line 106 is then routed through the active area (AA) of the display (e.g., between pixels) to the inactive area of the display on the opposing side of the display. There, the supplemental data line 106 is electrically connected to data line segment 104 in the inactive area of the display at electrical connection 110. In this way, signals from data line segment 102 are provided to data line segment 104 without requiring rerouting of the data line in the border of physical opening 52. Therefore, in FIG. 8, physical opening 52 can have a very small border region (because no data lines are rerouted through the border region). The gate lines in the display may optionally still be rerouted through the border region of the physical opening. In another possible embodiment, date driver circuitry may be provided on both sides of the display, removing the need to route the gate lines around the physical opening.

Figure 9:
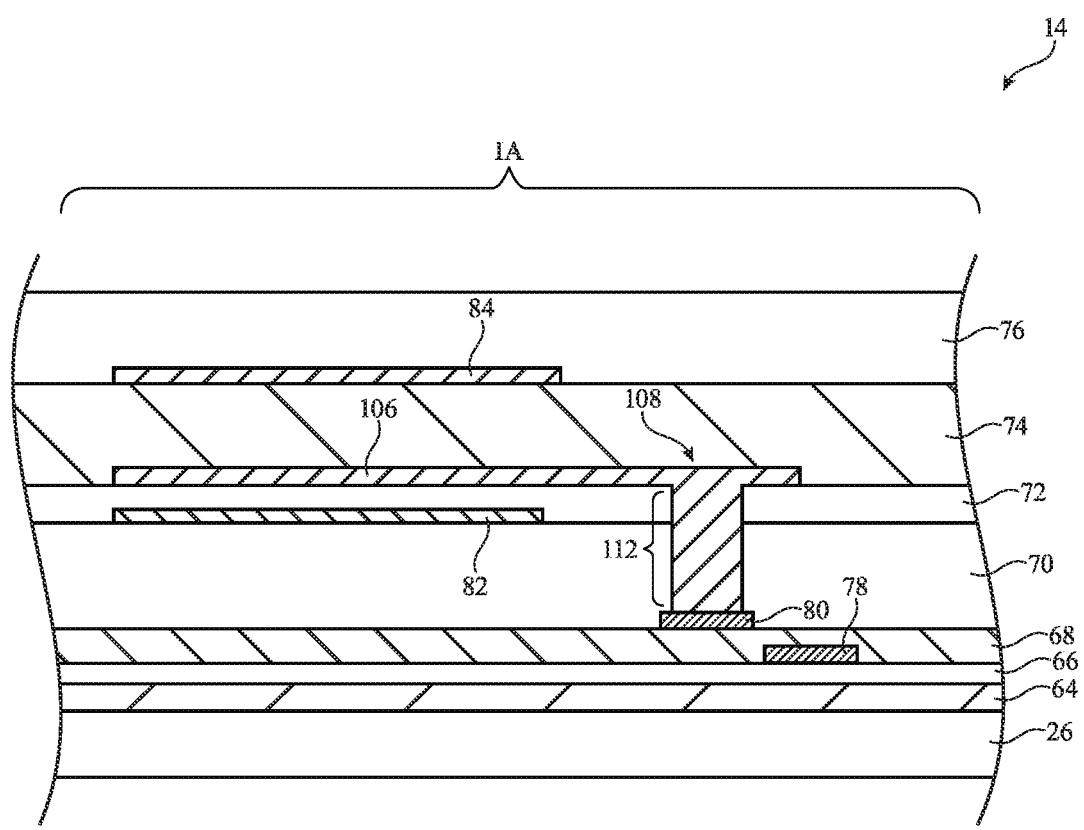
FIG. 9 is a cross-sectional side view of an illustrative display showing the supplemental data line of FIG. 8 in accordance with an embodiment.

FIG. 9 is a cross-sectional side view of the inactive area of the display in FIG. 8 showing supplemental data lines 106. As shown in FIG. 9, layers formed on substrate layer 26 include dielectric layers such as buffer layer 64 and gate insulator layer 66. Additional interlayer dielectric layers 68 and 70 may be formed over gate insulator layer 66. A first metal layer 78 may be formed on gate insulator 66 and covered by interlayer dielectric layer 68. A second metal layer 80 may be formed on interlayer dielectric layer 68 and covered by interlayer dielectric layer 70. As shown in FIG. 6, in the active area of the display metal layers 78 and 80 serve as gate lines (G) for display 14. However, in the inactive area of the display as shown in FIG. 9, metal layers 78 and 80 may serve as signal paths for data line signals (e.g., metal layers 78 and 80 help provide signals to data lines D from a display driver circuit).

An additional metal layer (metal layer 82) may be formed over interlayer dielectric layer 70. As shown in connection with FIG. 6, in the active area of the display metal layer 82 (SD1) may serve as a data line (e.g., data line D in FIG. 2) for display 14. However, in the inactive area of the display as shown in FIG. 9, metal layer 82 may serve as a power supply distribution line for display 14. For example, metal layer 82 may form a positive power supply distribution line ELVDD (as shown in FIG. 3) or may form a ground power supply distribution line ELVSS (as shown in FIG. 3). Metal layer 82 may be covered by passivation layer 72. Passivation layer 72 may be formed from an inorganic material such as silicon nitride or silicon dioxide. Passivation layer 72 may be formed from any other desired material. Organic planarization layers 74 and 76 may be formed over passivation layer 72. Organic planarization layers 74 and 76 may be formed from any desired material. Organic planarization layers 74 and 76 may be formed from the same material or from different materials.

Metal layer 84 (SD2) may be formed between organic planarization layers 74 and 76. In the inactive area of the display as shown in FIG. 9, metal layer 82 may serve as a power supply distribution line for display 14 (similar to as in the active area as shown in FIG. 6). For example, metal layer 82 may form a positive power supply distribution line ELVDD (as shown in FIG. 3) or may form a ground power supply distribution line ELVSS (as shown in FIG. 3). In one possible embodiment, both metal layers 82 and 84 form a positive power supply distribution line ELVDD in the inactive area shown in FIG. 9.

Supplemental data line 106 may be formed from a metal layer that is formed over passivation layer 72. Organic planarization layer 74 may be formed over supplemental data line 106. Supplemental data line 106 may be electrically connected to metal layer 80 (which provides the data line signal) using via 112. In other words, conductive via 112 forms electrical connection 108 between supplemental data line 106 and data line segment 102. In FIG. 9, conductive via 112 is formed from the same material (and in the same deposition step) as supplemental data line 106. This example is merely illustrative, and conductive via 112 may be formed from any desired number and type of layers of metal.

Supplemental data line 106 (e.g., a metal layer between passivation layer 72 and organic planarization layer 74) may be routed through the active area of the display. On the other side of the display, another electrical connection (110) may electrically connect the supplemental data line to data line segment 104.

This example of a metal layer between passivation layer 72 and organic planarization layer 74 being used to form supplemental data line 106 is merely illustrative. If desired, supplemental data line 106 may be formed from another metal layer in the display, may be formed from multiple metal layers within the display, etc. However, using the metal layer between passivation layer 72 and organic planarization layer 74 (and between ELVDD signal paths formed by metal layers 82 and 84) may prevent cross-talk.

In the example of FIG. 8, a supplemental data line is routed through the active area of the display to electrically connect data line segments on opposing sides of an opening within the display. In FIG. 8, the electrical connections of the supplemental data line to the data line segments are both in the inactive area of the display. However, this example is merely illustrative. The electrical connections of the supplemental data line to the data line segments may instead both be in the active area of the display (as in FIG. 10). In yet another embodiment, the electrical connection between the supplemental data line and one data line segment may be in the active area of the display and the electrical connection between the supplemental data line and the other data line segment may be in the inactive area of the display (as in FIG. 11).

Figure 10:
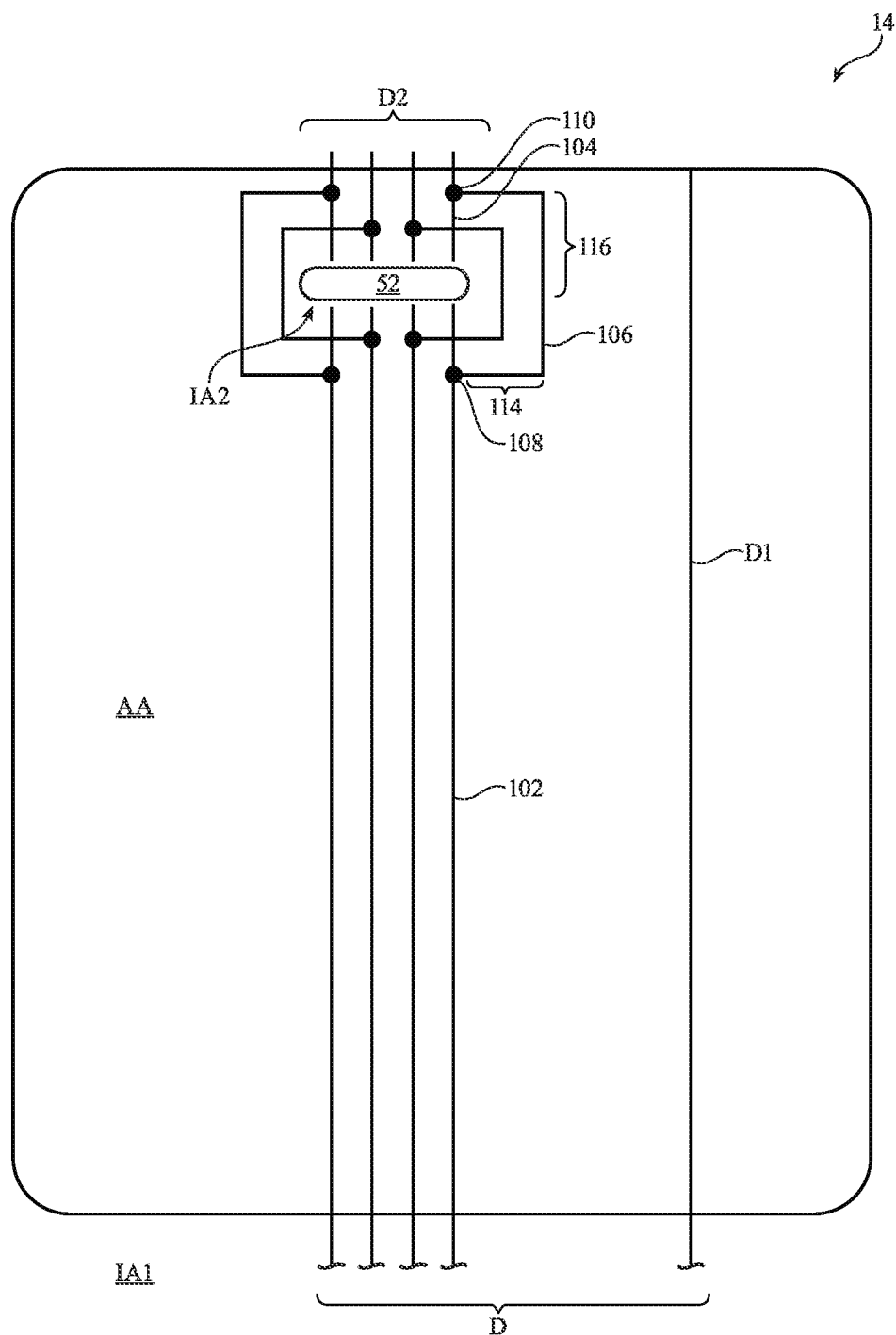
FIG. 10 is a top view of an illustrative display showing how data lines may include first and second data line segments on opposing sides of an opening in the active area and a supplemental data line that is electrically connected to both the first and second data line segments in the active area of the display in accordance with an embodiment.

FIG. 10 is a top view of an illustrative display having a substrate 26 with a physical opening 52. As shown in FIG. 10, display 14 may have a number of data lines D that provide signals to columns of pixels within the display. Some of the data lines, such as data line D1, are uninterrupted by physical opening 52. These data lines may therefore extend across the display to provide signals to each pixel in a column (similar to as shown in FIG. 2, for example).

Some of the data lines, such as data lines D2, may be interrupted by physical opening 52. To provide the requisite data line signals to pixels on both sides of physical opening 52, each of the data lines D2 may have a first data line segment 102 (sometimes referred to as a data line portion) on a first side of the physical opening and a second data line segment 104 (sometimes referred to as a data line portion) on a second, opposing side of the physical opening. Data line segments 102 and 104 are not electrically connected by rerouting a portion of the data line around the border of the physical opening as in FIG. 5. Instead, a supplemental data line 106 is provided.

Supplemental data line 106 is electrically connected to data line segment 102 in the active area (AA) of the display at electrical connection 108. Supplemental data line 106 is then routed through the active area of the display to be electrically connected to data line segment 104 at electrical connection 110 in the active area of the display. In this way, signals from data line segment 102 are provided to data line segment 104 without requiring rerouting of the data line in the border of physical opening 52. Therefore, in FIG. 10, physical opening 52 can have a very small border region (because no data lines are rerouted through the border region). The gate lines in the display may optionally still be rerouted through the border region of the physical opening. In another possible embodiment, date driver circuitry may be provided on both sides of the display, removing the need to route the gate lines around the physical opening.

In FIG. 10, supplemental data lines 106 may be formed from a layer of metal between passivation layer 72 and organic planarization layer 74 (as shown in FIG. 9) or another desired layer of metal. Horizontal portions of supplemental data lines 106 such as horizontal portion 114 may be routed above a signal line that provides an emission enable control signal EM to the pixels (see FIG. 3 with emission enable control signal EM applied to the gates of transistors T4 and T5). The signal line that provides emission enable control signal EM may sometimes be referred to as a gate line or an emission line. Routing the horizontal portions of supplemental data lines 106 above a gate line that provides emission enable control signal EM may mitigate cross-talk. Vertical portions of supplemental data lines 106 such as vertical portion 116 may be routed between positive power signal supply paths (e.g., ELVDD supply lines) formed from metal layers 82 and 84 (similar to as shown in FIG. 9) to mitigate cross-talk.

Figure 11:
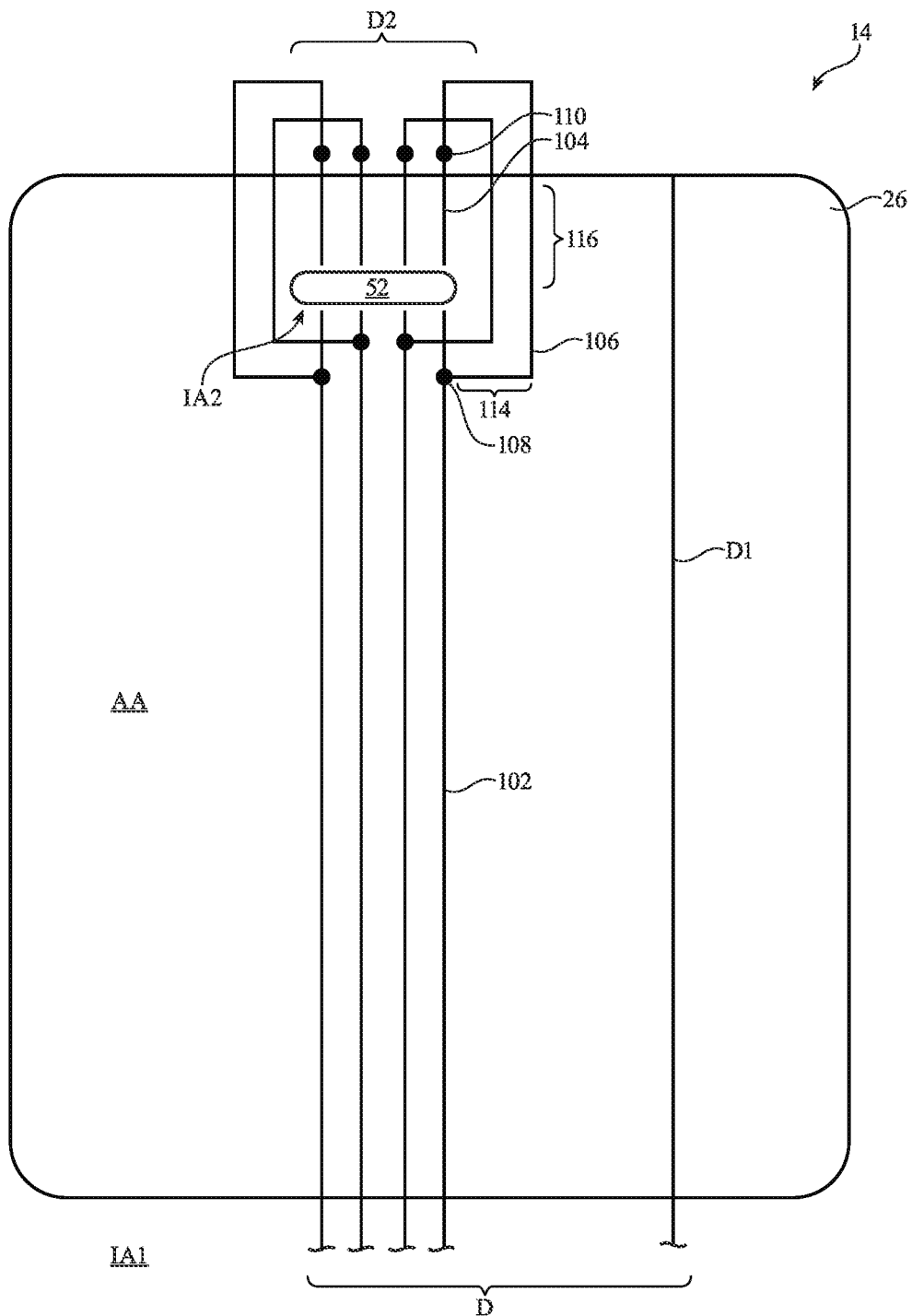
FIG. 11 is a top view of an illustrative display showing how data lines may include data line segments on opposing sides of an opening in the active area and a supplemental data line that is electrically connected to one of the data line segments in the active area of the display and the other data line segment in the inactive area of the display in accordance with an embodiment.

In some embodiments, forming the electrical connections between the supplemental data lines and both data line segments in the active area of the display (as in FIG. 10) may be difficult. For example, if physical opening 52 is large (meaning a large number of data lines will be interrupted and therefore a large number of supplemental data lines will be required) and/or if the physical opening is positioned close to the edge of the active area (meaning that space for routing the supplemental data lines to and making electrical connections 110 will be limited), it may be desirable to form electrical connections between the supplemental data lines and one of the data line segments in the inactive area of the display. FIG. 11 shows an embodiment of this type.

FIG. 11 is a top view of an illustrative display having a substrate 26 with a physical opening 52. As shown in FIG. 11, display 14 may have a number of data lines D that provide signals to columns of pixels within the display. Some of the data lines, such as data line D1, are uninterrupted by physical opening 52. Some of the data lines, such as data lines D2, may be interrupted by physical opening 52. To provide the requisite data line signals to pixels on both sides of physical opening 52, each of the data lines D2 may have a first data line segment 102 on a first side of the physical opening and a second data line segment 104 on a second, opposing side of the physical opening. Data line segments 102 and 104 are not electrically connected by rerouting a portion of the data line around the border of the physical opening as in FIG. 5. Instead, a supplemental data line 106 is provided.

Supplemental data line 106 is electrically connected to data line segment 102 in the active area (AA) of the display at electrical connection 108. Supplemental data line 106 is then routed through the active area of the display to be electrically connected to data line segment 104 at electrical connection 110 in the inactive area of the display. In this way, signals from data line segment 102 are provided to data line segment 104 without requiring rerouting of the data line in the border of physical opening 52. Therefore, in FIG. 11, physical opening 52 can have a very small border region (because no data lines are rerouted through the border region). The gate lines in the display may optionally still be rerouted through the border region of the physical opening. In another possible embodiment, date driver circuitry may be provided on both sides of the display, removing the need to route the gate lines around the physical opening.

In FIG. 11, supplemental data lines 106 may be formed from a layer of metal between passivation layer 72 and organic planarization layer 74 (as shown in FIG. 9) or another desired layer of metal. As discussed in connection with FIG. 10, horizontal portions of supplemental data lines 106 such as horizontal portion 114 may be routed above a signal line that provides an emission enable control signal EM to the pixels. Vertical portions of supplemental data lines 106 such as vertical portion 116 may be routed between positive power signal supply paths (e.g., ELVDD supply lines) formed from metal layers 82 and 84 (similar to as shown in FIG. 9).

Two or more of the aforementioned arrangements may be used for data lines in a single display if desired. Each data line may use any of the aforementioned arrangements to provide data signals to pixels on both sides of a physical opening within the active area.

The foregoing is merely illustrative and various modifications can be made by those skilled in the art without departing from the scope and spirit of the described embodiments. The foregoing embodiments may be implemented individually or in any combination.

What is claimed is:

1. A display comprising:
a substrate having an active area that includes an array of pixels, an inactive area that surrounds the active area, and an opening within the active area, wherein the opening has first and second opposing sides; and
a data line coupled to the array of pixels, wherein the data line has a first segment on the first side of the opening, a second segment on the second side of the opening, and a supplemental path that is routed through the active area between the first and second segments, wherein the supplemental path is electrically connected to the first segment in the inactive area, and wherein the supplemental path is electrically connected to the second segment in the active area.

2. The display defined in claim 1, wherein the supplemental path comprises third and fourth segments that are orthogonal to the first and second segments.

3. The display defined in claim 2, wherein the third segment is formed in the inactive area and wherein the fourth segment is formed in the active area.

4. The display defined in claim 2, wherein the supplemental path comprises a fifth segment that is parallel to the first and second segments.

5. The display defined in claim 4, wherein the fifth segment has portions in both the active area and the inactive area.

6. The display defined in claim 1, wherein the supplemental path is at least partially formed by a first metal layer and wherein the first metal layer is interposed between second and third metal layers that form power supply distribution paths.

7. The display defined in claim 1, wherein the supplemental path has a portion that is routed above an emission line that carries an emission enable control signal.

8. The display defined in claim 1, wherein the supplemental path has a portion that is routed above a power supply distribution path.

9. The display defined in claim 1, further comprising:
an additional data line coupled to the array of pixels, wherein the additional data line has a third segment on the first side of the opening, a fourth segment on the second side of the opening, and an additional supplemental path that is routed through the active area between the third and fourth segments and wherein the additional supplemental path is electrically connected to the third segment in the active area.

10. The display defined in claim 1, wherein the opening is a physical hole in the substrate.

11. The display defined in claim 1, wherein the opening is a transparent window in the substrate that does not contain any display pixel or display signal routing components.

12. A display comprising:
a substrate having an active area that includes an array of pixels, an inactive area that surrounds the active area, and an opening within the active area, wherein the opening has first and second opposing sides; and
a data line comprising:
a first vertical segment on the first side of the opening;
a second vertical segment on the second side of the opening;
a first horizontal segment on the first side of the opening, wherein the first horizontal segment is positioned in the inactive area;
a second horizontal segment on the second side of the opening, wherein the second horizontal segment is positioned in the active area; and
a third vertical segment between the first and second horizontal segments, wherein the first vertical segment, the second vertical segment, the third vertical segment, the first horizontal segment, and the second horizontal segment are electrically connected.

13. The display defined in claim 12, wherein the first vertical segment is electrically connected to the first horizontal segment in the inactive area.

14. The display defined in claim 12, wherein the second vertical segment is electrically connected to the second horizontal segment in the active area.

15. The display defined in claim 12, wherein the third vertical segment is electrically connected to the first horizontal segment in the inactive area.

16. The display defined in claim 15, wherein the third vertical segment is electrically connected to the second horizontal segment in the active area.

17. The display defined in claim 12, wherein the third vertical segment is positioned partially in the active area and partially in the inactive area.

18. The display defined in claim 12, wherein the opening is a physical hole in the substrate.

19. A display comprising:
a substrate having an active area that includes an array of pixels, an inactive area that surrounds the active area, and an opening within the active area, wherein the opening has first and second opposing sides; and
data lines coupled to the array of pixels, wherein the data lines comprise:
a first data line that comprises:
a first segment on the first side of the opening;
a second segment on the second side of the opening; and
a first supplemental path that is routed through the active area and that is electrically connected to both the first and second segments, wherein the supplemental path is electrically connected to the first segment in the inactive area and wherein the supplemental path is electrically connected to the second segment in the active area; and
a second data line that comprises:
a third segment on the first side of the opening;
a fourth segment on the second side of the opening; and
a second supplemental path that is routed through the active area and that is electrically connected to both the third and fourth segments, wherein the supplemental path is electrically connected to the third segment in the active area and wherein the supplemental path is electrically connected to the fourth segment in the active area.

\* \* \* \* \*